US006995795B1

(12) United States Patent
Losee et al.

(10) Patent No.: US 6,995,795 B1
(45) Date of Patent: Feb. 7, 2006

(54) METHOD FOR REDUCING DARK CURRENT

(75) Inventors: David L. Losee, Fairport, NY (US); Christopher Parks, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 786 days.

(21) Appl. No.: 09/660,105

(22) Filed: Sep. 12, 2000

(51) Int. Cl.
*H04N 3/14* (2006.01)
*H04N 5/335* (2006.01)
*H04N 9/64* (2006.01)
*G11C 19/28* (2006.01)

(52) U.S. Cl. ...................... 348/243; 348/312; 348/320; 377/58

(58) Field of Classification Search ................ 348/312, 348/243, 320; 377/58
See application file for complete search history.

(56) References Cited

U.S. PATENT DOCUMENTS 3,911,379 A * 10/1975 Yamaguchi ................. 333/165
4,194,213 A * 3/1980 Kano et al. ................. 257/159
4,468,684 A * 8/1984 Esser et al. ................. 257/222
4,613,402 A 9/1986 Losee et al.
4,712,135 A * 12/1987 Hashimoto et al. ......... 348/317
4,780,764 A * 10/1988 Kinoshita et al. ........... 348/296
4,908,518 A 3/1990 Losee et al.
4,963,952 A 10/1990 Janesick
5,115,458 A * 5/1992 Burkey et al. ................ 377/58
5,151,380 A 9/1992 Hynecek
5,235,198 A 8/1993 Stevens et al.
5,382,978 A * 1/1995 Tanaka ....................... 348/317
5,385,860 A * 1/1995 Watanabe ................... 438/144
5,388,137 A * 2/1995 Bosiers et al. ................ 377/58
5,523,787 A * 6/1996 Fukuba ....................... 348/319
5,757,427 A * 5/1998 Miyaguchi .................. 348/243
5,825,840 A * 10/1998 Anagnostopoulos ......... 377/60
6,157,053 A * 12/2000 Tanabe ....................... 257/239

OTHER PUBLICATIONS

Sequin et al, Charge Transfer Devices, Academic Press Inc., 1975, pp. 32-42.

* cited by examiner

*Primary Examiner*—Thai Tran
*Assistant Examiner*—James M. Hannett
(74) *Attorney, Agent, or Firm*—Peyton C. Watkins

(57) ABSTRACT

A method for reducing dark current within an image sensor includes applying, at a first time period, a first set of voltages to the phases of gate electrodes of vertical shift registers sufficient to accumulate holes of the vertical shift register, beneath each gate electrode and applying, at a second time period, a second voltage to a first set of the gate electrodes while simultaneously applying a more positive voltage to a second set of gate electrodes, the second voltage being of sufficient potential so holes that were accumulated beneath the second set of gate electrodes during the first time are collected and stored beneath the first set of gate electrodes during the second time period. Moreover, the method applies, at a third time period, a third voltage to the second set of gate electrodes while simultaneously applying a more positive voltage to the first set of gate electrodes, such that the previously accumulated holes beneath the first set of gate electrodes are transferred beneath the second set of gate electrodes; and returns the first and second sets of gate electrode voltages to their levels at the first time period.

6 Claims, 10 Drawing Sheets

METHOD FOR REDUCING DARK CURRENT

FIELD OF THE INVENTION

The present invention relates to charge coupled devices (CCDs), and more particularly to reducing the level of dark current associated with these types of devices.

BACKGROUND OF THE INVENTION

Charge coupled devices (CCDs) that are used as image sensors are typically formed in lightly doped silicon materials. Light incident on the device and penetrating into the silicon produces electrons and holes in numbers proportional to the incident light intensity. The photogenerated electrons, having a higher mobility than the holes, are the preferred carrier to be collected and detected in such devices. These photogenerated electrons are transported in channels formed in lightly doped p-type silicon. Both, so-called, frame-transfer and interline transfer type CCD image sensing devices are typically fabricated in such lightly doped silicon. In interline transfer type devices and in some types of frame transfer type devices this is a lightly doped and relatively deeply diffused p-type region on an n-type silicon substrate. We will refer to such deeply diffused p-type regions as a p-well. Other types of frame transfer type devices may be fabricated in lightly doped p-type epitaxial silicon layers. Additional p-type dopant can be placed within surface regions of the silicon to form barriers and channel stops. These barriers and channel stops operate to confine signal charge within the CCD shift register (channel stops), in interline transfer type devices they can confine charge within the photodiode regions (barriers) and also separate individual phases of the CCD (barriers). The p-type doping used in these channel stop regions can provide a conductance path for movement of holes in and out of the active areas of the device. The conductance of these channel stops, however, is relatively low and, in certain circumstances, additional means are required to provide needed conductivity for the movement of the holes. An example of one means is described in U.S. Pat. No. 5,151,380, where a contact is formed and a metal conductor is added to provide sufficient conductance. One situation which can require a rapid and long distance movement of holes is in the, so-called, accumulation mode clocking of the CCD shift registers as will be described in the paragraphs below. Therefore, a shortcoming in the prior art exists in that there is a need for such added conductors to provide for conductance of hole charge in CCD image sensing devices operating in this mode of clocking.

For CCD image sensors in general, it is desirable to reduce the generation and collection of thermally generated charge produced either in photodiode regions or in the shift register regions of the device. The rate of production of such thermally generated charge is referred to as dark current. Dark current is undesirable because the thermally generated charge cannot be easily distinguished from the signal charges produced by light exposure. A common approach to reduce the dark current generated in the photodiode regions in interline transfer devices is to provide a surface p-type region with an accumulation of holes. Similarly, to reduce the dark current emanating from the CCD shift register surface regions, it is also desirable to maintain an accumulation of holes at the silicon surface. A four phase full frame type CCD device and clock sequence which accomplishes this has been described in U.S. Pat. No. 4,963,952, where a significant reduction in dark current generated under the CCD gates was observed when holes were accumulated beneath all gates. A gate which is biased in such a way to maintain the accumulation of holes at the silicon surface, is said to be in accumulation. A gate which is biased so that holes are not present is said to be in depletion.

Commonly-assigned U.S. Pat. No. 5,115,458, discloses additional invention related specifically to clocking techniques to reduce dark current in, so called, true two phase CCDs with a frame transfer architecture. By their description, true two phase CCD shift registers are those wherein each of the gate electrodes consist of a single conductive element with a storage and barrier region provided within the charge transfer channel. Description of such true two phase CCD shift registers as applied to interline transfer architecture has been disclosed in commonly-assigned U.S. Pat. Nos. 4,908,518 and 5,235,198. While the illustrations in this invention depict primarily such true two phase CCD shift registers, it should be clear that the invention also applies to other embodiments of two phase CCDs. Some examples of such embodiments, but not all such embodiments, may be found in references such as C. H. Sequin and M. F. Tompsett, Charge Transfer Devices, Academic Press, N.Y. 1975, pgs. 32–42.

CCD area arrays are typically arranged as rows and columns of light sensing elements, or pixels. In the typical operation of such a CCD image sensor array, charge is transferred row-by-row through a set of vertical shift registers, into a horizontal shift register, then the charges are transferred by the horizontal shift register to a detection circuit. The time during which a row of charges is transferred through the horizontal shift register is called the horizontal read-out time. During this time the vertical shift register CCD gates are held at some set of constant voltages. The vertical CCD gate voltages are clocked only during the brief period of time required to transfer a row of charge into the horizontal register, and are quiescent otherwise. This period of quiescence constitutes a majority of the time of operation of the device. It is during this period of quiescence that dark current problems arise in the vertical shift registers.

A true two phase CCD refers to a device in which there are two physical gates per pixel, with each gate having both a transfer and a storage region formed in the silicon under it. There are two voltage phase lines $\Phi_1$ and $\Phi_2$. The charge coupling concept is used in frame transfer and interline transfer CCD image sensing devices. An example of a frame transfer area image sensor 10 is shown in FIG. 1. Indicated, schematically, in FIG. 1*a* are the components of such a device, namely: a vertical shift register array, 40, arranged with rows and columns of pixels; channel stop regions 20, arranged to provide vertical channels 12; vertical gate electrodes 15 and 25; a horizontal shift register region 30, with gates 31 and 32; and, output amplifier 35. Electrical connections, to channel stop region 20, vertical gates 15 and 25 and horizontal gates 31 and 32, are also indicated. A schematic cross-section for a true two phase CCD is shown in FIG. 1*b*. A true two phase CCD is described in detail in commonly assigned U.S. Pat. No. 4,613,402. A true two phase CCD has storage and transfer regions beneath each phase gate. In FIG. 1*b* the phase gates are labeled by 101 and 106, and are situated above a silicon substrate 100 and isolated from the substrate by an insulating layer 103. The transfer and storage regions for these gates are indicated, respectively, as regions 102 and 104 for gates 101($\Phi_1$), and 107 and 108 for gates 106 ($\Phi_2$). In this drawing, additional dopants are indicated to be present in regions 102 and 107 in order to provide a suitable potential energy profile for efficient transfer of charge in the CCD register. These dopants are in addition to other dopants commonly introduced to provide, for example, a buried channel, for transport of signal charges. In FIG. 1*c*, the potential energy profile in the channel beneath the gates is indicated for the condition that voltage $\Phi_2$ is more positive than the voltage $\Phi_1$. For this voltage condition charge packets 201 and 202 reside in the storage regions 108 beneath the respective $\Phi_2$ gates. The dopants in regions 102 and 107 produce the potential energy steps 205 and 206 which provide the directionality for charge transfer.

In this disclosure only n-buried channel devices will be considered. This invention applies equally to p-buried channel devices. For an n channel CCD, which is illustrated, the buried channel is formed by an n-type doping in a p-type substrate or in a p-well in an n-type substrate. The transfer and storage buried channel regions are differentiated by less or more of the n-buried channel doping, respectively. Commonly-assigned U.S. Pat. No. 4,613,402 discloses a detailed procedure for making true two phase CCD devices. In a buried channel CCD, dark current arises from three main sources: (1) generation from a midgap state resulting from either the disrupted lattice or an impurity at a depleted Si—$SiO_2$ interface, (2) generation in the depletion region, that is, a region depleted of mobile charge, as a result of an impurity or defect with a midgap state and (3) diffusion of electrons to the buried channel from the substrate. All three sources, result in spurious charges being collected as signal in the buried channel. The mechanism for dark current generation both at the surface and in the depletion region has been described in commonly-assigned U.S. Pat. No. 5,115,458. It is an object of this invention to reduce the surface state component of dark current.

A clocking sequence which accomplishes such an accumulation of surface holes at all gates of the vertical shift register for a majority of the time, is called, accumulation mode clocking. One such clocking sequence for the vertical shift register of a two-phase CCD device is diagrammed in FIG. 2. In the first part of this figure, FIG. 2*a*, the clock voltages which are applied to first phase, $\Phi_1$, and second phase, $\Phi_2$, are diagrammed as a function of time. Time intervals, to through $t_3$, designate the various parts of this clock sequence. The charge transfer process resulting from the clocking diagrammed in FIG. 2*a* is shown schematically in FIG. 2*b*, where, for the various time periods indicated in FIG. 2*a*, the potential energy, and the location of signal electrons, are schematically indicated. In FIG. 2*b*, the vertical direction represents the potential energy of electrons and the horizontal direction representing distance along the CCD shift register. In FIG. 2*b*, the gate pair, $\Phi_2$ and $\Phi_1$ on the left, define a first pixel position and the gate pair $\Phi_2$ and $\Phi_1$, on the right define a second pixel position. In FIG. 2*b*, the signal charges, denoted by the circular objects, and the hole charges, denoted by the + signs, are diagrammed at times $t_0$ through $t_3$. Also, in this figure, the barrier region channel potential under the $\Phi_1$ gate is taken to be higher (i.e. a lower potential energy barrier) than the channel potential under the barrier region of the $\Phi_2$ gate. This situation is similar to that described in commonly-assigned U.S. Pat. No. 5,235,198 and the clocking was termed, by them, as a "spill backward" mode. The reason for this terminology will be indicated below.

As represented in FIG. 2*b*, the positive clock voltage transitions produce deeper potential energy regions for electrons and higher potential energy regions for holes. Conversely, the more negative clock voltages produce lower potential energy regions for holes and higher potential energy regions for electrons. This clocking sequence is equivalent to that shown in FIG. 5 of commonly-assigned U.S. Pat. No. 5,115,458. Note that for this example, the barrier region electron's potential energy on the left side of the $\Phi_1$ gate is lower than the potential energy of the barrier region on the left side of the $\Phi_2$ gate. The upshot of this potential energy difference is that, during the period when both gates are in accumulation, signal charge may be stored beneath either or both of the CCD gates. This particular mode of operation is called the "spill backward mode" because any signal charge in excess of what can be accommodated under the $\Phi_1$ accumulated gate, is spilled backwards, in this case to the $\Phi_2$ gate, when the clocks return to the hole accumulated state at time $t_3$.

In this illustration, it should be noted that the total hole charge under the gate pairs of each pixel, during each successive interval of the clocking, does not remain constant. For example, when both gates are biased negative (−9 volts is chosen as an example) an amount of holes, Q, is accumulated under each gate, and, thus, the total charge under the pair of gates is 2Q. The hole charge, q, under each gate, during each interval of time, is also indicated in the timing diagram FIG. 2*a*. When one gate is brought more positive, for example, to 0 volts in this illustration, the total hole charge is reduced to only 1Q. The excess hole charge, an amount Q per pixel, must be removed in some way. It is evident that approximately half of the total accumulated hole charge for each pixel must be removed in the transitions between times $t_0$ and $t_1$, and then replaced between $t_{3a}$ and $t_3$, respectively.

The typical path for such hole charge removal or replacement is via a p-doped region such as the channel stop. For large devices, the net charge that must be moved in this way is significantly impeded by the relatively high resistance of the p-type regions. While this is true for any CCD operating in accumulation mode, this is a particularly troublesome problem for devices which are fabricated in deeply diffused p-doped regions on an n-type substrate. The problem becomes more severe as the area of the devices are made larger. This deeply diffused p-type region, referred to as a p-well, is typically isolated or only weakly connected with surface p-regions such as channel stops. The total amount of charge which must be drained off during the time one of the gates is in depletion is nQ, where n is the total number of pixels in the image sensor. During the time required to drain off the excess hole charge, the local value of the p-well bias moves, particularly in the central regions of the device, creating an undesirable biasing which leads to poor imaging properties for the device. This undesirable potential variation is sometimes referred to as p-well bounce. There is, thus, a shortcoming within the prior art in avoiding p-well bounce when attempting to employ accumulation mode clocking.

It should be readily apparent that there remains a need within the art for a method and apparatus that can be used to clock image sensing devices in accumulation mode that does not result in dark current signal in interline transfer type CCD image sensors. In particular, it should be apparent that there is a need within the art for a method of operation of interline CCD devices with reduced dark current and which also avoids the need to transport hole charge by large distances. Prior art devices, as previously discussed, have a problem in not providing a suitable clocking sequence which results in lowered dark current signals in large area devices, and in particular in interline transfer type CCD image sensors.

SUMMARY OF THE INVENTION

In CCD image sensors and, in particular, in devices formed in a p-well, such as interline transfer type CCD image sensors, photogenerated charge is first collected in an array of rows and columns of photosensitive sites, photodiodes or photocapacitors. These photosites are situated adjacent to the gates of CCD shift registers arranged column-wise in the array. For an interline transfer CCD device these photosites are photodiodes. Charge from the photodiodes is transferred to corresponding CCD gates, typically once per frame time, by application of a positive voltage pulse to one of the sets of gates, such pulse voltage being more positive than that required for transfer of charge within the CCD shift register.

It is an object of this invention to reduce the dark current which is generated during the horizontal read-out, period.

It is a further object of the present invention to eliminate the need for added conductors in CCD image sensing devices operating in the, so called, accumulation mode of clocking.

It is still another object of the invention to maintain accumulation mode clocking while avoiding p-well bounce.

It is a further object of this invention to disclose a suitable clocking sequence which reduces the dark current signal in interline transfer type CCD image sensors and in image sensors utilizing a deeply diffused p-well.

The present invention addresses the above discussed needs within prior art by providing a method for reducing dark current within an image sensor comprising the steps of:

- providing the image sensor with a matrix of pixels arranged in a plurality of rows and columns with a vertical shift register allocated for each of the columns and at least one horizontal shift register operatively coupled to the vertical shift registers, wherein each of the columns of pixels are formed with the vertical shift registers having a plurality of phases allocated for each of the pixels and a plurality of gate electrodes of the vertical shift register for each of the pixels, and clocking means for causing the transfer of charge from the pixels to the vertical shift registers and through the horizontal shift register;
- applying, at a first time period, a first set of voltages to the phases of the gate electrodes of the vertical shift registers sufficient to accumulate holes in the vertical shift register, beneath each gate electrode;
- applying, at a second time period, a second voltage to a first set of the gate electrodes while simultaneously applying a more positive voltage to a second set of gate electrodes, the second voltage being of sufficient potential so holes that were accumulated beneath the second set of gate electrodes during the first time are collected and stored beneath the first set of gate electrodes during the second time period;
- applying, at a third time period, a third voltage to the second set of gate electrodes while simultaneously applying a more positive voltage to the first set of gate electrodes, such that the previously accumulated holes beneath the first set of gate electrodes are transferred beneath the second set of gate electrodes; and
- returning the first and second sets of gate electrode voltages to their levels at the first time period.

BRIEF DESCRIPTION OF THE DRAWINGS

FIG. 3b is a schematic diagram of the charge transfer process during the clocking sequence of FIG. 3a;

FIG. 4b is a schematic illustration of the charge transfer process associated with the clocking sequence of FIG. 4a;

FIG. 5b is a schematic illustration of the charge transfer process associated with the clocking sequence of FIG. 5a;

DETAILED DESCRIPTION OF THE INVENTION

As discussed above, during the so-called accumulation mode clocking of the vertical shift register, one set of gates changes from a condition where holes are accumulated beneath the gate, at the Si—$SiO_2$ interface, to a condition where the surface is depleted of holes. This results in excess hole charge being present which must be drained off. During the time required to drain off the excess hole charge, the p-well or substrate potential moves. This undesirable potential variation is referred to as p-well bounce. The present invention provides a means for maintaining accumulation mode clocking while avoiding the p-well bounce.

Figure 3A:
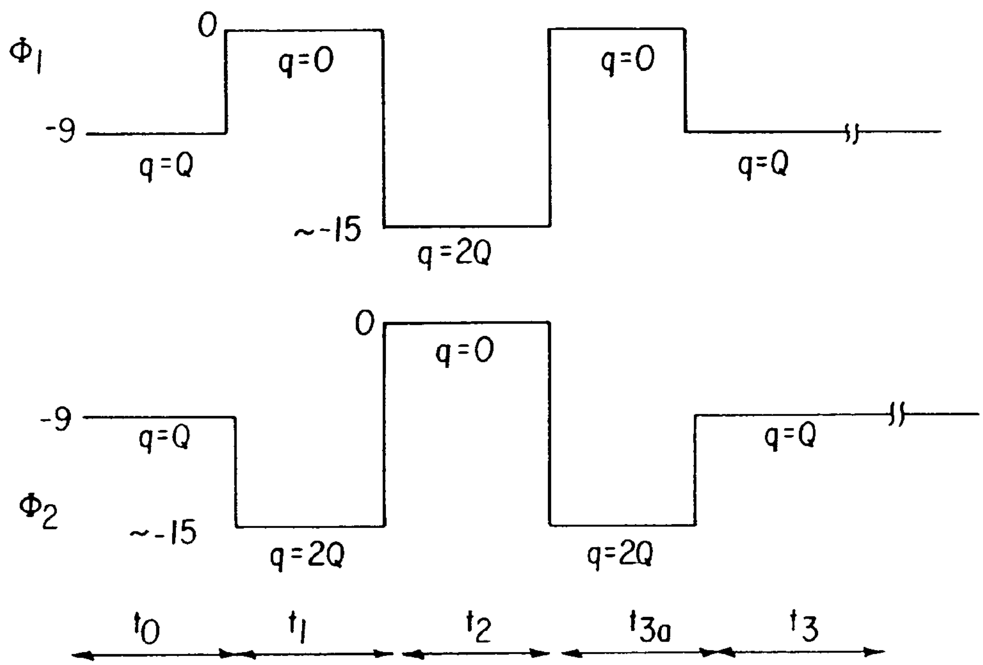
FIG. 3a is an illustration of a modified clocking sequence as envisioned by the present invention wherein both sets of gates are biased into accumulation, holding a total charge 2Q beneath each gate pair during the entire clock sequence.
Figure 3B:
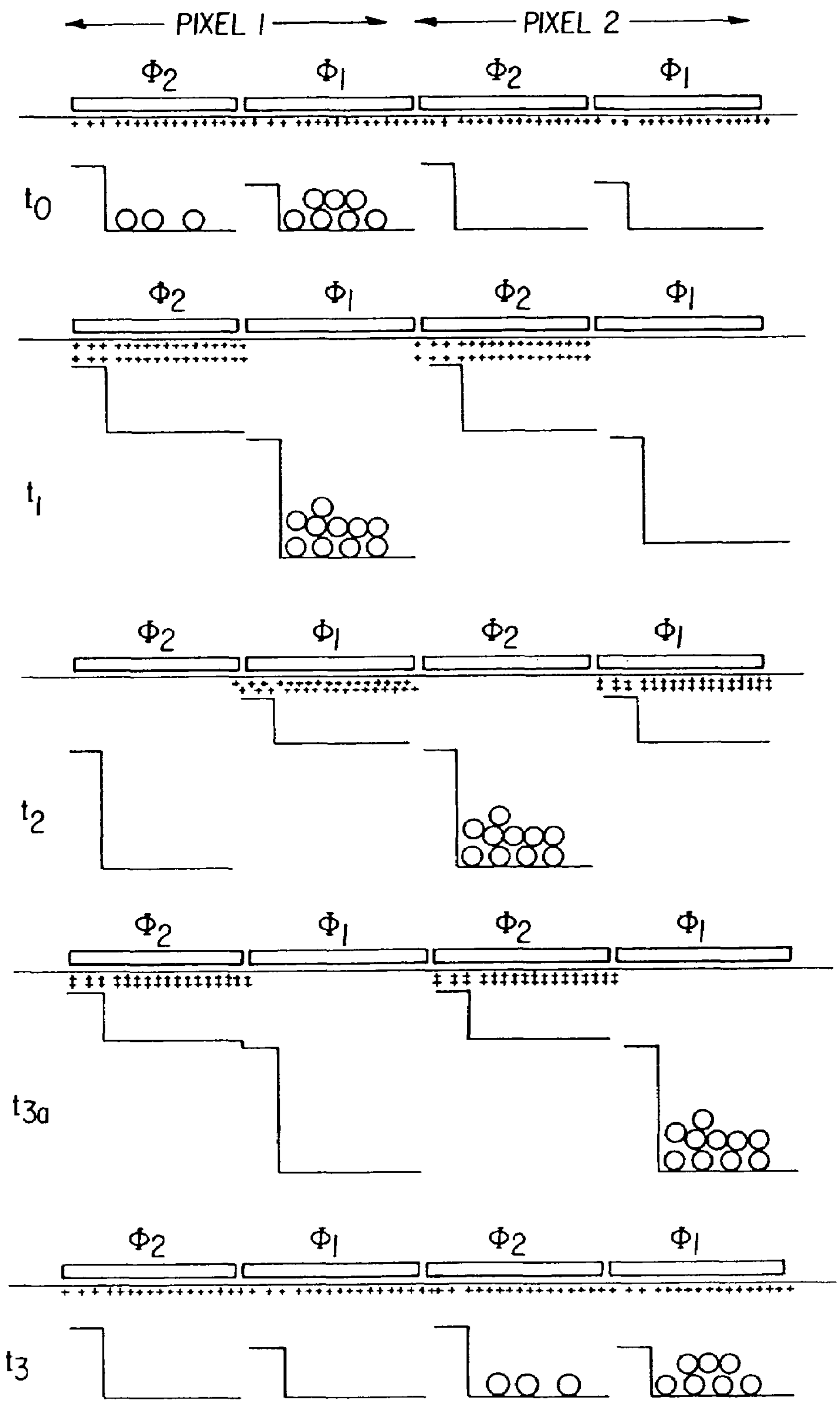

The fundamental problem that results in p-well bounce is that of disposal of the excess hole charges accumulated beneath one of the sets of gates of the CCD when that phase is switched out of accumulation and into depletion, and, conversely, the replenishment of the required hole charges when returning to the gates to accumulation. This problem becomes more acute for larger area devices because of the greater distances over which this excess charge must be transported. The present invention discloses a method of accumulation mode clocking for a two phase CCD shift register such that the distance over which most or all of the excess charge is transported is substantially reduced, thus reducing the p-well bounce. One such modified clocking sequence is shown in FIG. 3a., which is a modification, according to the present invention, of the spill-backwards mode previously discussed. Here, during time $t_0$, both sets of gates are biased into accumulation, holding charge Q beneath each gate. In time interval $t_1$, the gate indicated by $\Phi_1$ is switched to a higher voltage which drives it into depletion, and $\Phi_2$ is switched to a more negative voltage, the voltage being adjusted such that the equilibrium hole charge, now equal to 2Q, is held beneath the $\Phi_2$ gate. During time $t_2$, $\Phi_2$ is switched into depletion and $\Phi_1$ is then switched to a more negative voltage such that hole charge equal to 2Q is held beneath the $\Phi_1$ gate. During time $t_{3a}$, $\Phi_1$ is again switched to a more positive voltage, and $\Phi_2$ is switched to more negative voltage such that hole charge equal to 2Q is again held beneath the $\Phi_2$ gate. This sequence results in signal charges being transported through one complete CCD stage. At time $t_3$ both gates are returned to the bias voltages such that hole charge Q is held beneath each of the gates of the CCD. It is to be noted that the movement of holes during this sequence is very much reduced compared with the prior art. The distance over which the excess charge has been transported is approximately the length of one of the CCD gates, thus substantially reducing the distance and quantity of hole charge movement, and, consequently reducing the p-well bounce. FIG. 3*b* shows schematically, and step by step, the charge transfers occurring during this clocking sequence.

In FIG. 3*b*, the + symbols indicate the hole charges accumulated under each gate during each step of this clock sequence and the circles represent signal electrons. It is evident that the hole charge Q under, say, the $\Phi_1$ gate, during time $t_0$, has been collected and held under the adjacent $\Phi_2$ gate during time $t_1$. This same quantity of hole charge is transferred to gate $\Phi_1$ and held there during time interval $t_2$. Again, the charge has only moved by one gate length. A similar movement of charge occurs between times $t_2$ and $t_{3a}$. Finally, during time $t_3$, hole charge is again distributed, approximately equally, beneath both $\Phi_1$ and $\Phi_2$ gates. Time interval $t_3$ corresponds to the time required to read out a line of charge from the horizontal shift register.

Figure 1A:
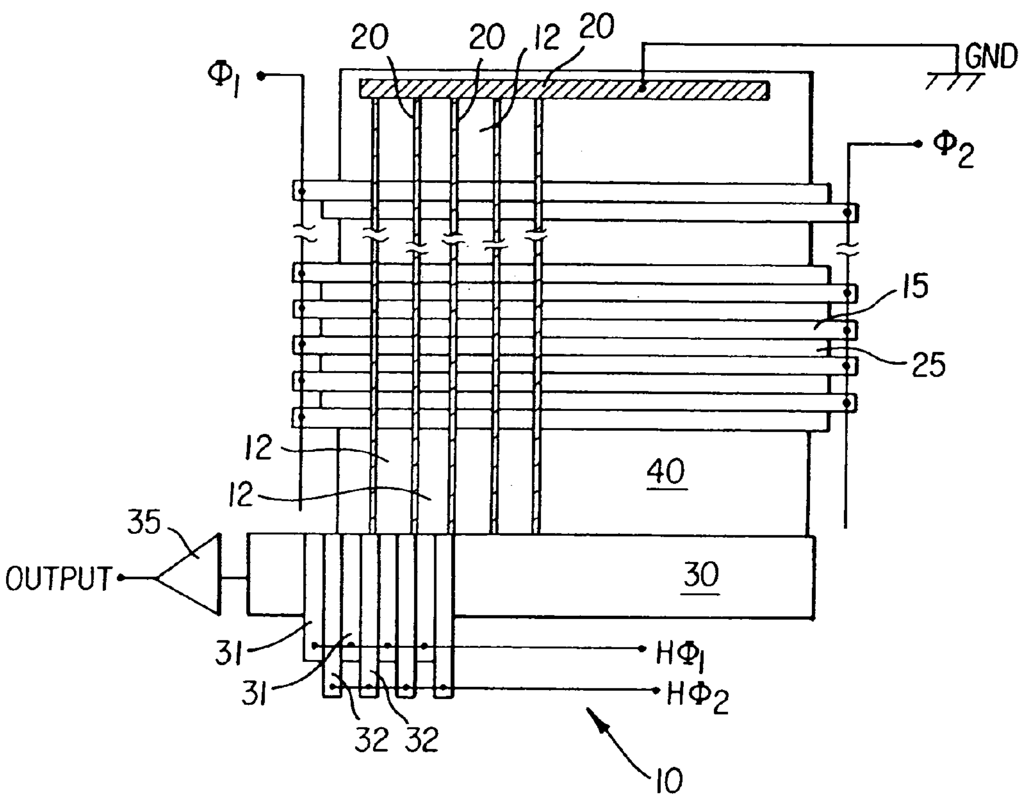
FIG. 1a schematic representation of a prior art CCD image sensor.
Figure 1B:
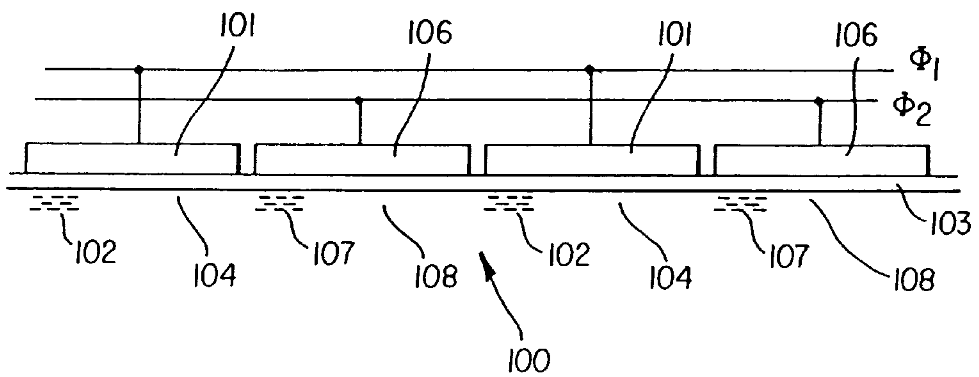
FIG. 1b is a schematic cross-sectional view of a prior art true two phase CCD shift register.
Figure 1C:
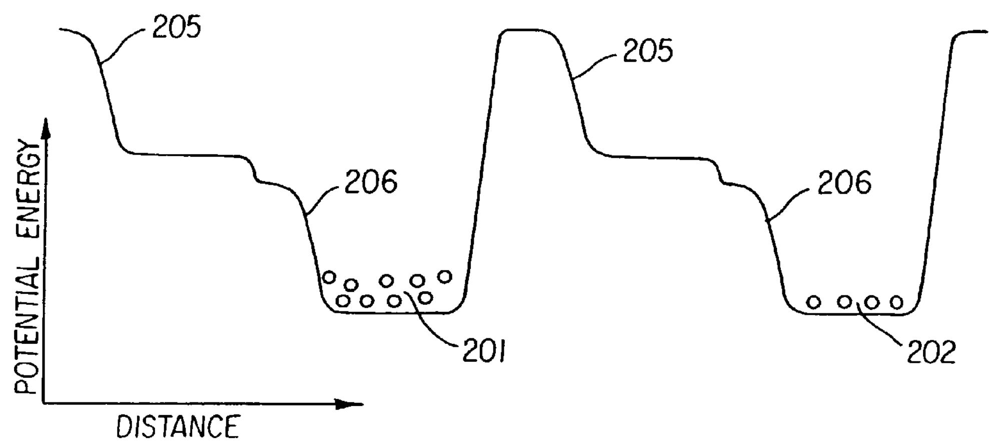
FIG. 1c is a diagram of the potential energy for electrons in a prior art CCD channel as a function of distance along a portion of the channel of a true two phase CCD shift register.
Figure 2A:
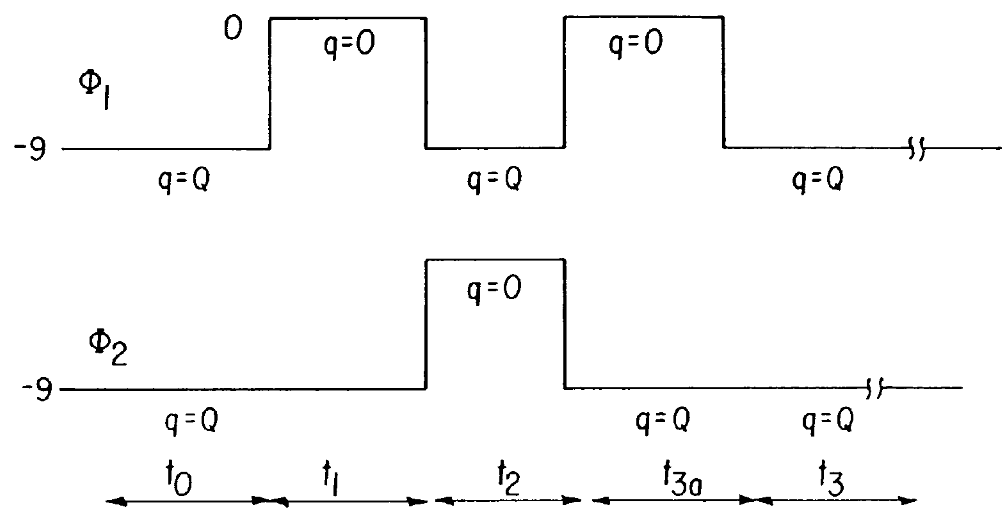
FIG. 2a is a prior art clocking sequence for the vertical shift register of a two-phase, interline CCD device using accumulation mode clocking, where the vertical axis of the drawing represents the applied voltage and the horizontal axis represents time.
Figure 2B:
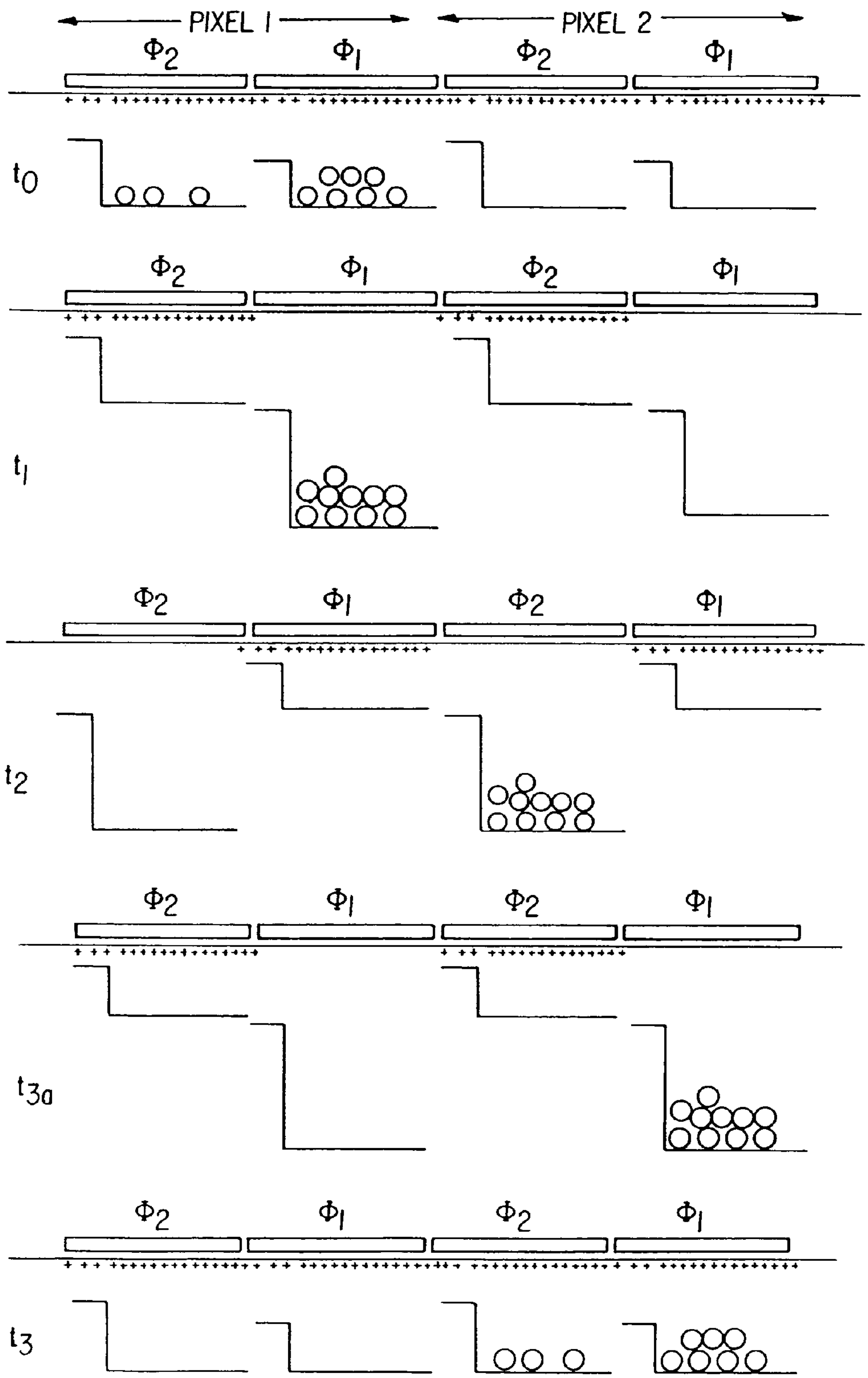
FIG. 2b is a sequence of schematic diagrams of the charge transfer process during the clocking sequence of FIG. 2a, where the vertical axes represent the potential energy for electrons, the horizontal axes represent position along the CCD shift register, and the + signs represent hole charges accumulated at the silicon surface.
Figure 4A:
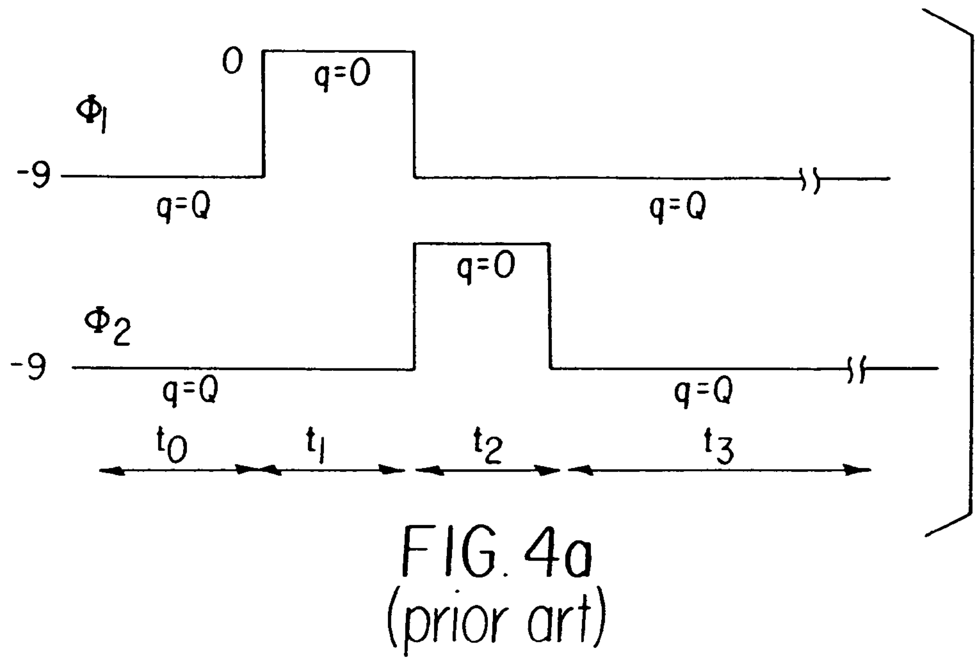
FIG. 4a is an alternative prior art accumulation mode clocking sequence.
Figure 4B:
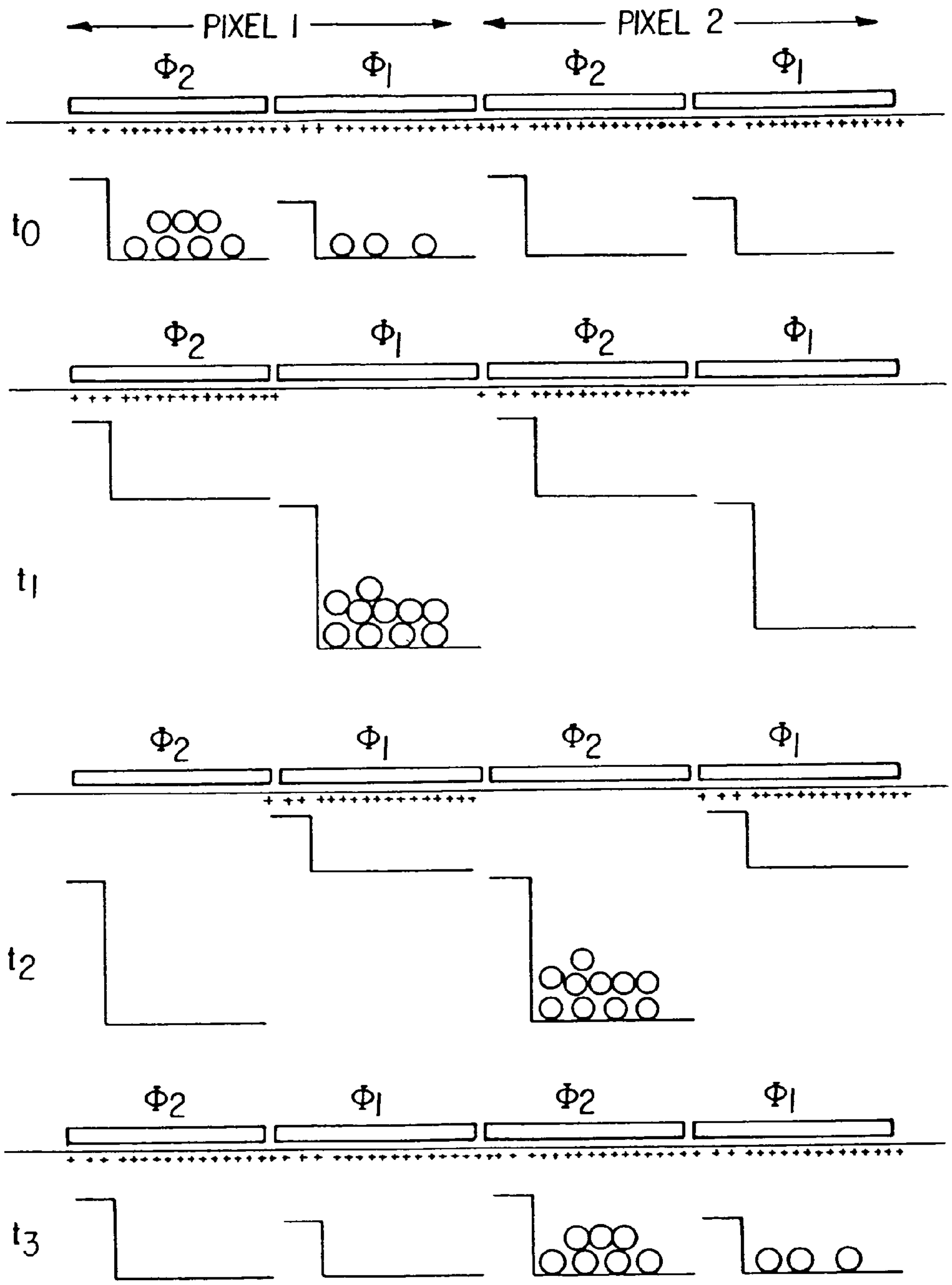

Another prior art sequence for accumulation mode clocking is shown in FIG. 4*a*. Here, during time $t_0$, both phases are at a negative voltage sufficient to accumulate hole charge Q beneath each gate, and the total hole charge beneath the pair of gates is 2Q. During time $t_1$, $\Phi_1$ is switched high, and $\Phi_2$ is maintained low. The total stored hole charge is now only Q. Again, the excess hole charge must be dispersed. Upon the transition from time $t_2$ to $t_3$, additional holes, approximately of amount Q, must again be supplied to each pair of gates. The charge transfer process for each step of the clock sequence is schematically indicated in FIG. 4*b*. Again, as in FIG. 2, in the barrier region, on the left side of the $\Phi_1$ gate, the electron's potential energy is lower than the potential energy of the barrier region on the left side of the $\Phi_2$ gate. The upshot of this potential energy difference is that during the period when both gates are in accumulation that charge may be stored beneath either or both of the CCD gates. In this case, signal charge in excess of what can be stored under the accumulated $\Phi_2$ gate is spilled forward, to be held under the $\Phi_1$ gate, hence the designation, spill forward clocking. Again, especially for large area device, total hole charge nQ, must be either removed or replenished in this clocking sequence.

Figure 5A:
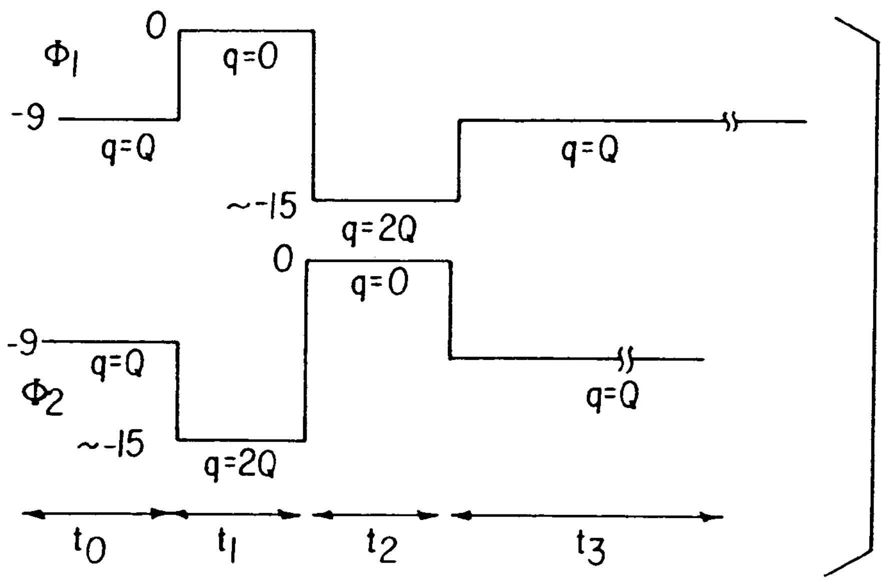
FIG. 5a is a modified accumulation mode clocking sequence as envisioned by the present invention.
Figure 5B:
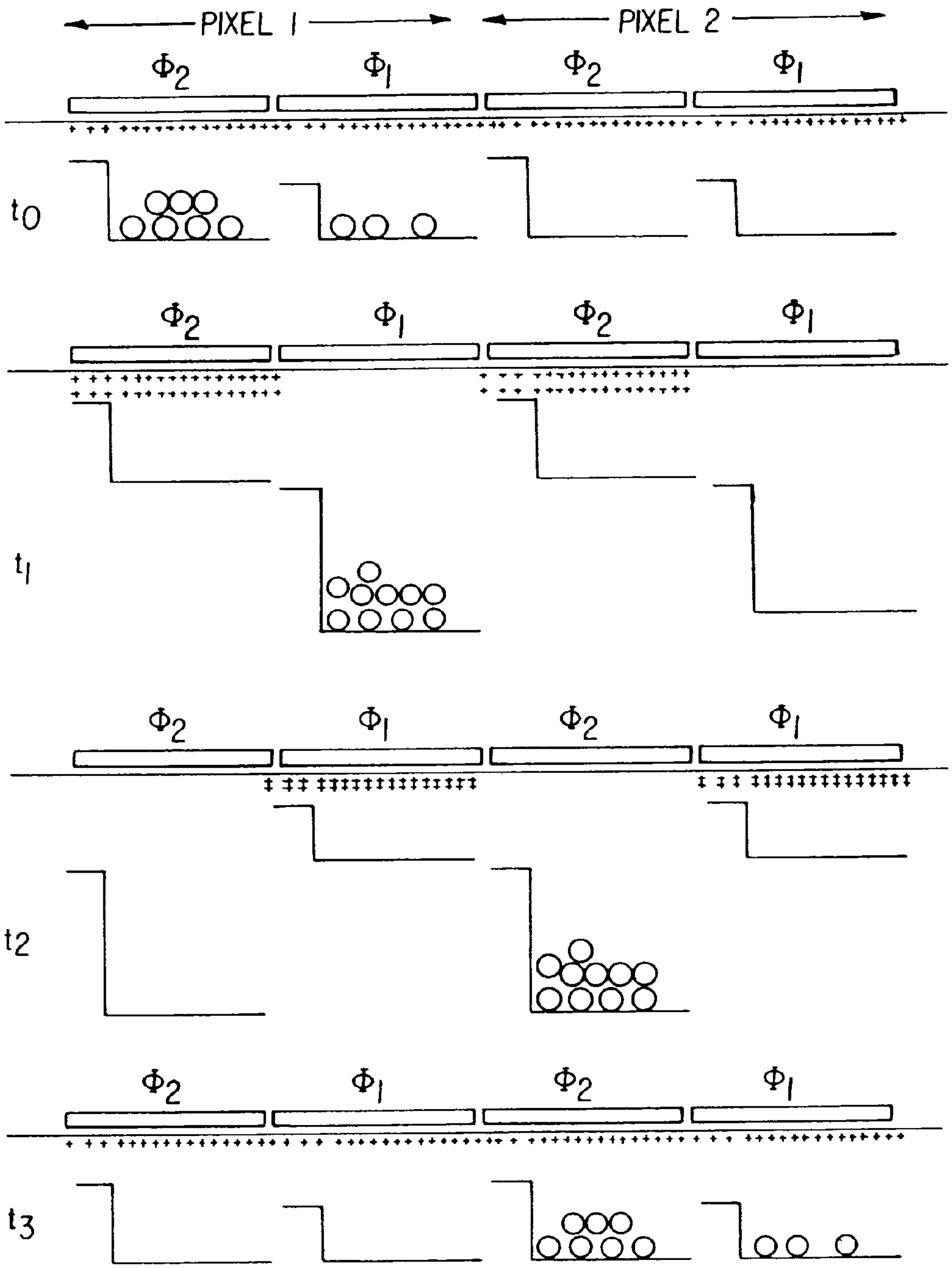

To reduce or eliminate the resulting p-well bounce, in accordance with the present invention, a modified clock sequence may be used as shown in FIG. 5*a*. In this figure, in a manner similar to the method shown in FIG. 3, an additional negative voltage can be applied to cause the excess hole charge to be transferred to the $\Phi_2$ gate during time $t_1$. During time $t_2$, $\Phi_2$ is switched high and $\Phi_1$ is then switched to a more negative voltage such that hole charge, equal to 2Q, is now held beneath the $\Phi_1$ gate. During time $t_3$, $\Phi_1$ and $\Phi_2$ are both returned to a bias which accumulates charge Q under each gate respectively. The charge transfer for this clock sequence is shown schematically in FIG. 5*b*, where the charge distributions during each time interval are diagrammed.

The forgoing discussion applies to the operation of the vertical shift register clocking during the line by line readout of the image sensing device. In an interline transfer type image sensor, additional voltage pulses are provided to transfer photogenerated charges from the photodiodes associated with each pixel to the vertical shift registers. Typically, this entails application, once per frame, of a more positive going pulse to one of the CCD gates, so as to transfer photocharge from the diodes into the corresponding vertical CCD stages.

Figure 6:
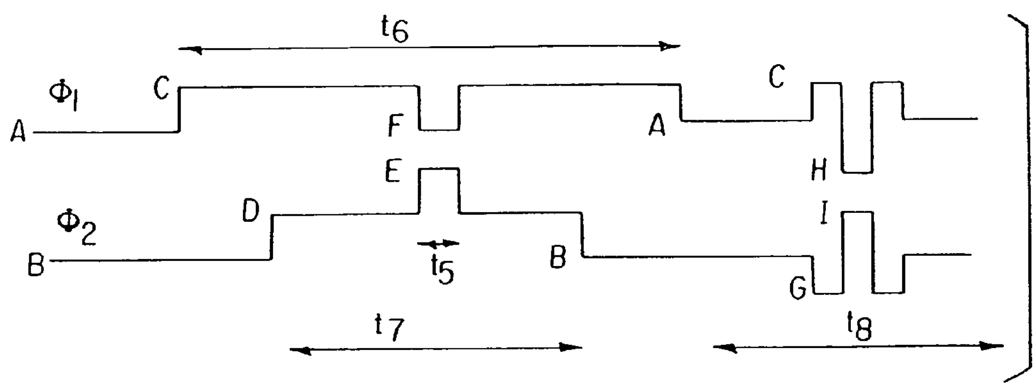
FIG. 6 is a timing diagram illustrating the clocking sequence employed for an interline device using the accumulation mode clocking of the present invention.

FIG. 6 illustrates the typical clocking of an interline transfer image sensor in accordance with the confines of the present invention. The photodiodes will integrate for a predetermined period of time, after which it is required that a high level pulse be applied to one of the CCD gates in order to transfer photocharge out of the photodiodes and into the CCD shift registers. This transfer from the photodiodes to the vertical shift registers happens once per frame. This high level pulse is indicated by the timing diagram shown in FIG. 6 by the pulse on the $\Phi_2$ phase that occurs during the time period $t_5$. In most devices such a pulse is typically applied only once per frame time or once per field time. In FIG. 6 this is shown to occur within a relatively longer time interval $t_6$. During time $t_6$ the $\Phi_1$ clock first rises from level A to level C. During time interval $t_7$, but within $t_6$, clock phase $\Phi_2$ rises similarly from level B to level D, during time interval $t_7$. Both levels A and B are such that the CCD surfaces beneath the gates accumulates holes, i.e. 9 volts. At a later time, during interval $t_5$, within $t_6$, and $t_7$, a positive pulse to voltage E is applied to $\Phi_2$ and, simultaneously, a negative pulse to level F is applied to $\Phi_1$. The voltage level E is sufficient to empty the photocharge out of the photodiodes and into the corresponding CCD stages in the vertical shift register. Subsequently, $\Phi_2$ is returned to level B' at the end of $t_7$ and $\Phi_1$ is returned to level A' at the end of $t_6$. The vertical shift register is subsequently operated with the accumulated mode clocking sequence during time interval $t_8$ with the voltage sequence indicated, similar to that previously discussed in the description relating to FIG. 3, until all lines of photocharges have been transferred to, and read out of, the horizontal shift register.

As an example, referring to FIG. 6, an interline transfer type device was operated with the following clock voltages corresponding to those shown in Table 1 below. Initially $\Phi_1$ and $\Phi_2$ are in accumulation (voltages A and B, respectively) at −9 volts. $\Phi_1$ and $\Phi_2$ sequentially move to less negative voltage levels, (voltages C and D, respectively) which places them into depletion. During time interval $t_5$, a more positive voltage is applied to $\Phi_2$ (voltage E) to transfer charges from the photodiode into that phase of the CCD cells. Each phase then returns to accumulation mode before the modified accumulation mode vertical clocking of the present invention begins during time interval $t_8$. The required voltage levels for the vertical clocking are labeled as A, C and H for $\Phi_1$, and, B,G and I for $\Phi_2$ Values for these voltages are given in Table 1.

TABLE 1

| | | |
|---|---|---|
| A | 9 v | Accumulation for $\Phi_1$ |
| B | 9 v | Accumulation for $\Phi_2$ |
| C | 1 v | Depletion for $\Phi_1$ |
| D | 1 v | Depletion for $\Phi_2$ |
| E | +8 v | Photodiode Readout |
| F | 9 v | Accumulation for $\Phi_1$ |
| G | 13 v | Modified Accumulation for $\Phi_2$ |
| H | 13 v | Modified Accumulation for $\Phi_1$ |
| I | 1 v | Depletion for $\Phi_2$ |

Figure 7:
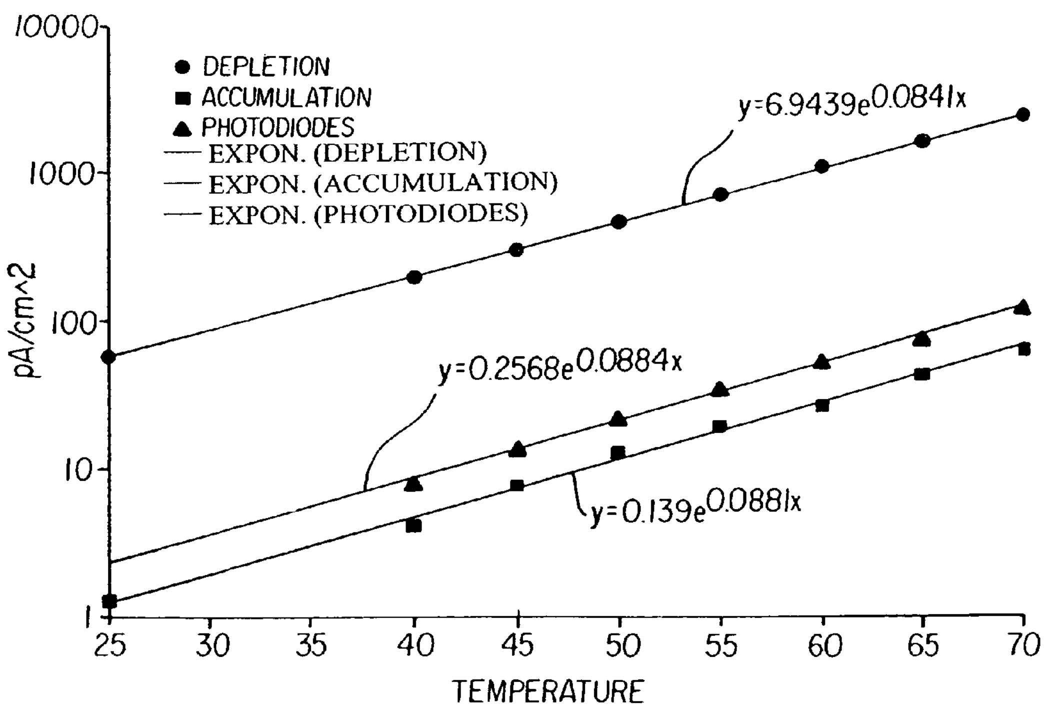
FIG. 7 is a graph of measurements from an example device, comparing the dark current generated in the CCD shift register in depletion and accumulation modes with that of the photodiodes.

The various components of the dark current were measured for the device operated in this manner and then compared with those measured using depletion mode clocking. Clocking the vertical CCD gates with the clock sequence suggested here, resulted in a dark current of 4 pA/cm$^2$. This is to be compared with the depletion mode clocking where the dark current was measured to be 194 pA/cm$^2$, a factor of 47 decrease in vertical CCD dark current. In FIG. 7, the various contributions to the dark current for the device are plotted as a function of device operating temperature. In the figure, the uppermost curve is the dark current due to the CCD shift register regions when conventional depletion mode clocking is employed. The lowermost curve is the dark current due to the CCD shift register regions when the clocking sequence disclosed in this invention is employed. The middle curve in FIG. 6 is the dark current due to the photodiodes of the device and is shown for comparison. It is seen that, at all temperatures, the CCD dark current is significantly reduced by the clocking described in this invention.

The invention has been described in detail with particular reference to certain preferred embodiments thereof, but it will be understood that variations and modifications can be effected within the spirit and scope of the invention.

PARTS LIST

10 Image sensor device
12 CCD channel
15 Vertical CCD Φ2 gate
20 Channel stop region
25 Vertical CCD Φ1 gate
31 Horizontal CCD HΦ1 gate
32 Horizontal CCD HΦ2 gate
35 Output amplifier
101 CCD gate
102 Barrier region
103 Insulator
104 Storage region
106 CCD gate
107 Barrier region
108 Storage region
201 Signal charge
202 Signal charge
205 Potential step
206 Potential step

What is claimed is:

1. A method for reducing dark current within an interline CCD image sensor comprising the steps of:

providing the interline CCD image sensor with a matrix of pixels arranged in a plurality of rows and columns with a vertical shift register allocated for each of the columns and at least one horizontal shift register operatively coupled to the vertical shift registers, wherein each of the columns of pixels are formed with the vertical shift registers having a plurality of phases allocated for each of the pixels and a plurality of gate electrodes of the vertical shift register for each of the pixels, and clocking means for causing the transfer of charge from the pixels to the vertical shift registers and through the horizontal shift register;

applying, at a first time period, a first set of voltages to the phases of the gate electrodes of the vertical shift registers sufficient to accumulate holes substantially at a surface of the image sensor in the vertical shift register, beneath each gate electrode;

applying, at a second time period, a second voltage to a first set of the gate electrodes while simultaneously applying a more positive voltage to a second set of gate electrodes, the second voltage being of sufficient potential so holes that were accumulated beneath the second set of gate electrodes during the first time are collected and stored beneath the first set of gate electrodes during the second time period;

applying, at a third time period, a third voltage to the second set of gate electrodes while simultaneously applying a more positive voltage to the first set of gate electrodes, such that the previously accumulated holes beneath the first set of gate electrodes are transferred beneath the second set of gate electrodes;

returning the first and second sets of gate electrode voltages to their levels at the first time period; and applying an additional positive voltage pulse to a first set of gate electrodes during a period of more positive voltage.

2. The method of claim 1 further including the step of applying voltages to the first and second sets of gate electrodes between the third applying step and the returning step to cause excess charge to be returned under the preceding gate electrode.

3. The method of claim 1 wherein the vertical shift registers are two-phase devices and wherein the third voltage is at substantially the same voltage as the second voltage.

4. The method of claim 2 wherein the step of applying the first voltage to the phases of the vertical shift registers occurs during a readout period of the horizontal shift register.

5. The method of claim 1 wherein the image sensor is an interline transfer type image sensor.

6. The method of claim 1 further comprising the step of substantially simultaneously applying a negative pulse to the second set of gate electrodes while the additional positive voltage pulse is applied to the first set of gate electrodes during the period of more positive voltage.

* * * * *